United States Patent [19]

Fimoff et al.

[11] Patent Number: 5,572,532
[45] Date of Patent: Nov. 5, 1996

[54] CONVOLUTIONAL INTERLEAVER AND DEINTERLEAVER

[75] Inventors: Mark Fimoff, Hoffman Estates; Scott F. Halozan, Des Plaines; Raymond C. Hauge, Fox River Grove, all of Ill.

[73] Assignee: Zenith Electronics Corp., Glenview, Ill.

[21] Appl. No.: 315,153

[22] Filed: Sep. 29, 1994

Related U.S. Application Data

[63] Continuation-in-part of Ser. No. 175,325, Dec. 29, 1993, abandoned.
[51] Int. Cl.$^6$ ............................................ H03M 13/22
[52] U.S. Cl. ................................................ 37/22
[58] Field of Search ................................ 371/2.1–2.2, 45

[56] References Cited

U.S. PATENT DOCUMENTS 5,241,563  8/1993  Paik et al. ........................... 375/1

Primary Examiner—Stephen M. Baker

[57] ABSTRACT

A convolutional interleaver or deinterleaver comprises an address signal generator for repeatedly generating [(B-1)N/2]+1 sequences of address signals, where B is a desired interleave depth and N is a value equal to or greater than the number of data bytes in a R-S block of the data stream. Each of the sequences corresponds to a respective row of a B column matrix, the first column of which comprises [(B-1)N/2]+1 consecutively numbered values. Each remaining column comprises the preceding column rotated by an integer multiple of N/B. The address signals are applied to a memory having [(B-1)N/2]+1 storage locations for reading the data stored at the address memory location and then writing the current data byte to the same memory location.

37 Claims, 10 Drawing Sheets

| VSB MODE M | DATA SYMBOLS PER FRAME | BITS PER SYMBOL | DATA BYTES PER FRAME | RS BLOCKS PER FRAME | INTERLEAVE GROUPS PER FRAME (B=26) | INTERLEAVE GROUPS PER FRAME (B=52) |
|---|---|---|---|---|---|---|
| 24 | 258,336 | 4.5 | 145,314 | 702 | 5589 | - |
| 16 | 258,336 | 4 | 129,168 | 624 | 4968 | 2484 |
| 8 | 258,336 | 3 | 96,876 | 468 | 3726 | 1863 |
| 4 | 258,336 | 2 | 64,584 | 312 | 2484 | 1242 |
| 2 | 258,336 | 1 | 32,292 | 156 | 1242 | 621 |

| VSB MODE M=16 | VSB MODE M=8 | VSB MODE M=4 | VSB MODE M=2 |
|---|---|---|---|
| 1111 +120 | | | |
| | 111 +112 | | |
| 1110 +104 | | | |
| | | 11 +96 | |
| 1101 +88 | | | |
| | 110 +80 | | |
| 1100 +72 | | | |
| | | | 1 +64 |
| 1011 +56 | | | |
| | 101 +48 | | |
| 1010 +40 | | | |
| | | 10 +32 | |
| 1001 +24 | | | |
| | 100 +16 | | |
| 1000 +8 | | | |
| 0111 −8 | | | |
| | 011 −16 | | |
| 0110 −24 | | | |
| | | 01 −32 | |
| 0101 −40 | | | |
| | 010 −48 | | |
| 0100 −56 | | | |
| | | | 0 −64 |
| 0011 −72 | | | |
| | 001 −80 | | |
| 0010 −88 | | | |
| | | 00 −96 | |
| 0001 −104 | | | |
| | 000 −112 | | |
| 0000 −120 | | | |

| | | | | | | | | | | | |
|---|---|---|---|---|---|---|---|---|---|---|---|
| 0 | 5101 | – | – | – | – | – | – | – | – | – | 1 |
| 1 | 5102 | – | – | – | – | – | – | – | – | – | 2 |
| 2 | 5103 | – | – | – | – | – | – | – | – | – | 3 |
| ' | ' | | | | | | | | | | ' |
| ' | ' | | | | | | | | | | ' |
| ' | ' | | | | | | | | | | ' |
| ' | ' | | | | | | | | | | ' |
| ' | ' | | | | | | | | | | ' |
| ' | ' | | | | | | | | | | ' |
| ' | ' | | | | | | | | | | ' |
| ' | ' | | | | | | | | | | ' |
| ' | ' | | | | | | | | | | 5304 |
| 5304 | ' | | | | | | | | | | 0 |

| 12 | 1  | 5  | 11 |
|----|----|----|----|
| 11 | 0  | 4  | 10 |
| 10 | 12 | 3  | 9  |
| 9  | 11 | 2  | 8  |
| 8  | 10 | 1  | 7  |
| 7  | 9  | 0  | 6  |
| 6  | 8  | 12 | 5  |
| 5  | 7  | 11 | 4  |
| 4  | 6  | 10 | 3  |
| 3  | 5  | 9  | 2  |
| 2  | 4  | 8  | 1  |
| 1  | 3  | 7  | 0  |
| 0  | 2  | 6  | 12 |

CONVOLUTIONAL INTERLEAVER AND DEINTERLEAVER

This application is a continuation-in-part of application Ser. No. 08/175,325, filed Dec. 29, 1993, now abandoned.

CROSS REFERENCE TO RELATED APPLICATIONS

This application discloses subject matter claimed in copending application Ser. No. 175,014, entitled DIGITAL TRANSMISSION SYSTEM WITH DATA RATE OPTIMIZED FOR NOISE IN TRANSMISSION MEDIUM; Ser. No. 175,085 entitled DATA SYSTEM HAVING 24 LEVEL SYMBOLS; Ser. No. 175,061, entitled DATA FRAME FORMAT FOR VARIABLE SIZE DATA CONSTELLATIONS; and Ser. No., 175,070, entitled SYMBOL TO BYTE CONVERTER, all filed Dec. 29, 1993 and all assigned to Zenith Electronics Corporation.

BACKGROUND OF THE INVENTION AND PRIOR ART

This invention relates generally to digital transmission systems and particularly to a digital data transmission system having a data frame structure and circuit arrangement selected to facilitate operations such as symbol to byte conversion, interleaving and deinterleaving and forward error correction. The system also facilitates the use of a data rate that is related to the signal to noise ratio (S/N ratio) of the transmission environment for enhancing system capacity.

U.S. Pat. No. 5,087,975 discloses a vestigial sideband (VSB) system for transmitting a television signal in the form of successive M-level symbols over a standard 6 MHz television channel. The television signal may, for example, comprise one or two compressed wideband HDTV signals or a number of compressed NTSC signals. While the number of levels M characterizing the symbols may vary depending on circumstances, the symbol rate is preferably fixed, such as at a rate of 684 H (about 10.76 Megasymbols/sec), where H is the NTSC horizontal scanning frequency. The number of symbol levels used in any particular situation is largely a function of the S/N ratio characterizing the transmission medium, a smaller number of symbol levels being used in situations where the S/N ratio is low. It is believed that the ability to accommodate symbol levels of 24, 16, 8, 4 and 2 provides adequate flexibility to satisfy conditions in most systems. It will be appreciated that lower values of M can provide improved S/N ratio performance at the expense of reduced transmission bit rate. For example, assuming a rate of 10.76M symbol/sec, a 2-level VSB signal (1 bit per symbol) provides a transmission bit rate of 10.76 Megabits/sec, a 4-level VSB signal (2 bits per symbol) provides a transmission bit rate of 21.52 Megabits/sec and so on up to a 24-level VSB signal which provides a transmission bit rate of about 48.43 Megabits/sec.

It is generally known that the S/N ratio performance of cable television plants decreases as the signal (channel) frequency increases. The foregoing attribute of an M-level VSB transmission system, i.e. improved S/N ratio performance as M decreases, is used in one aspect of the invention to compensate for the S/N ratio degradation in the higher frequency channels of CATV distribution plants. That is, according to this aspect of the invention, VSB transmission is effected in a CATV system wherein the lower frequency channels are transmitted using larger values of M. While the bit rate of the higher frequency channels is thereby reduced, the received signal may be reproduced with a S/N ratio comparable to that of the lower frequency channels.

Moreover, in accordance with other aspects of the invention, system efficiency, particularly in relation to receiver operations such as data interleaving and deinterleaving, symbol to byte conversion and forward error correction, may be greatly enhanced by selecting a data frame structure which facilitates these operations within the constraints of the variable M-level VSB character of the transmitted signal.

OBJECTS OF THE INVENTION

Accordingly, it is a principal object of this invention to provide a novel convolutional interleaver and/or deinterleaver.

Another object of this invention is to provide a circuit for deinterleaving convolutionally interleaved bytes of data supplied by a symbol to byte converter.

BRIEF DESCRIPTION OF THE DRAWINGS

These and other objects and advantages of the invention will be apparent upon reading the following description in conjunction with the drawings, in which:

FIG. 3A is a chart illustrating an implementation of the byte to symbol converter in the transmitter of FIG. 3;

FIG. 10 is another deinterleave address signal matrix suitable for use in an embodiment of the invention;

FIGS. 14, 15 and 16 are diagrams of respective convolutional interleave address signal matrices suitable for use in accordance with the invention.

DESCRIPTION OF THE PREFERRED EMBODIMENT

Figures 1, 2:
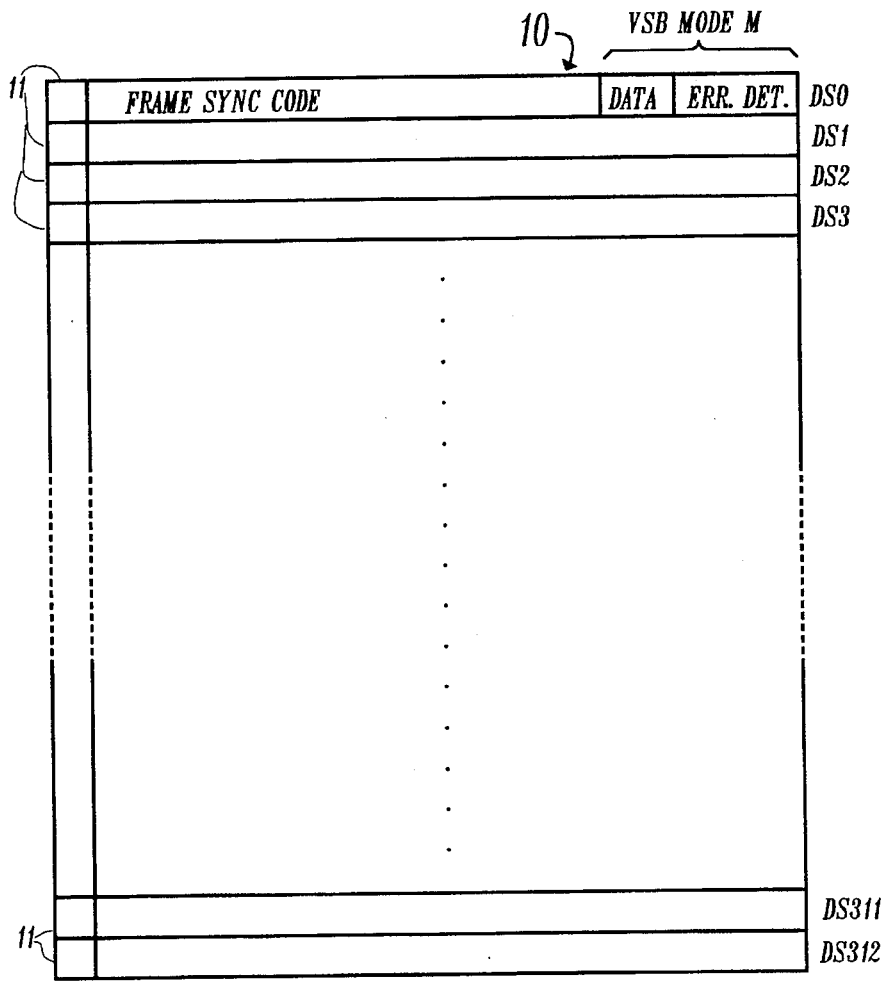
FIG. 1 illustrates the novel data frame structure of the invention.
FIG. 2 is a chart showing the relationship of data constellation size to the other parameters of the invention.

The structure of the novel data frame of the invention is illustrated in FIG. 1. This data frame format is claimed in copending application Ser. No. 175,061 above. The data frame, generally identified by reference numeral 10, comprises 313 data segments (DS) identified as DS0–DS312. Each data segment includes 828 symbols for data and 4 symbols defining a data segment sync character 11. Each data segment sync character 11 comprises four 2-level symbols which preferably assume the form disclosed in copending application Ser. No. 894,388. The first data segment DS0 comprises only 2-level symbols. These 2-level symbols represent a pseudo random sequence frame synchronization code, and an 8 symbol VSB mode, or control, signal that identifies the level M (e.g. 24, 16, 8, 4 or 2) of the symbols of the data fields of the remaining 312 data segments of the data frame. The first three bits of the eight bit VSB mode control byte identify the VSB mode and the remaining 5 bits comprise parity bits which may be used by the receiver for error detection. In the previously mentioned CATV distribution system, for example, the VSB mode signal would identify a relatively large M for low frequency channels and a smaller M for higher frequency channels. In a terrestrial broadcast environment, the VSB mode would most likely be M=2, 4 or 8.

Referring to the table of FIG. 2, each data symbol of a data segment DS1–DS312 represents either 4.5 bits (M=24), 4 bits (M=16), 3 bits (M=8), 2 bits (M=4), or 1 bit (M=2). Since there are a fixed number of data symbols per frame (312×828=258,336), the number of data bytes per frame will vary as shown. That is, each frame comprises 145,314 data bytes for VSB mode M=24; 129,168 data bytes for VSB mode M=16; 96,876 data bytes for VSB mode M=8; 64,584 data bytes for VSB mode M=4; and 32,292 data bytes for VSB mode M=2. However, while the number of data bytes per frame varies depending on the VSB mode M, it will be observed that for any particular value of M (24, 16, 8, 4 or 2), an integral number of bytes is provided in each frame. This characteristic of the structure of frame 10 substantially simplifies the design of a receiver such that frame synchronization will be effected at a rate corresponding to an integral number of data bytes regardless of the VSB mode (i.e. 24, 16, 8, 4 or 2 level symbols). As will be explained in further detail hereinafter, the receiver forward error correction circuitry, the receiver symbol to byte converter, and the receiver deinterleaver are preferably frame synchronized with the transmitted signal. The frame sync signal can be directly used for these purposes so long as there are an integral number of bytes, forward error correction blocks and interleave groups in each data frame for each of the VSB modes.

Reed-Solomon (RS) forward error correction is used in the receiver of the invention. A standard transport packet size of 87 bytes has been established by the MPEG (Motion Picture Experts Group) committee. Adding 20 parity bytes to each such transport packet results in an RS block size of 207 data bytes, allowing for the correction of 10 byte errors per RS block. As seen in FIG. 2, an RS block size of 207 bytes advantageously results in an integral number of RS blocks per frame for all of the selected VSB modes, thereby allowing the receiver RS decoder to be synchronized by the frame sync signal. A convolutional interleave group size (B) is defined according to the invention as comprising 26 or 52 data bytes (other values may be used) which also results in an integral number of interleave groups per frame regardless of the selected VSB mode (except for M=24 and B=52) as shown in FIG. 2. This also allows the frame sync signal to be used to periodically synchronize the receiver deinterleaver, thereby simplifying its design.

Figure 3B:
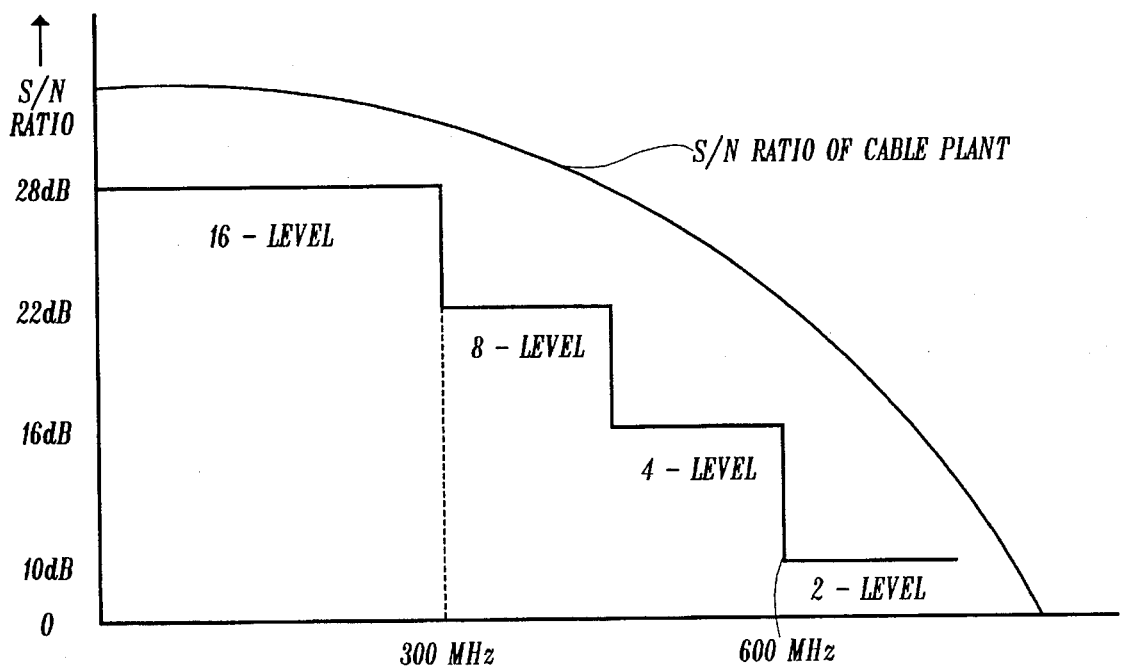
FIG. 3B is a chart illustrating the variation of S/N ratio with frequency in a cable plant and assignment of VSB mode for optimizing cable plant operation.
Figure 3:
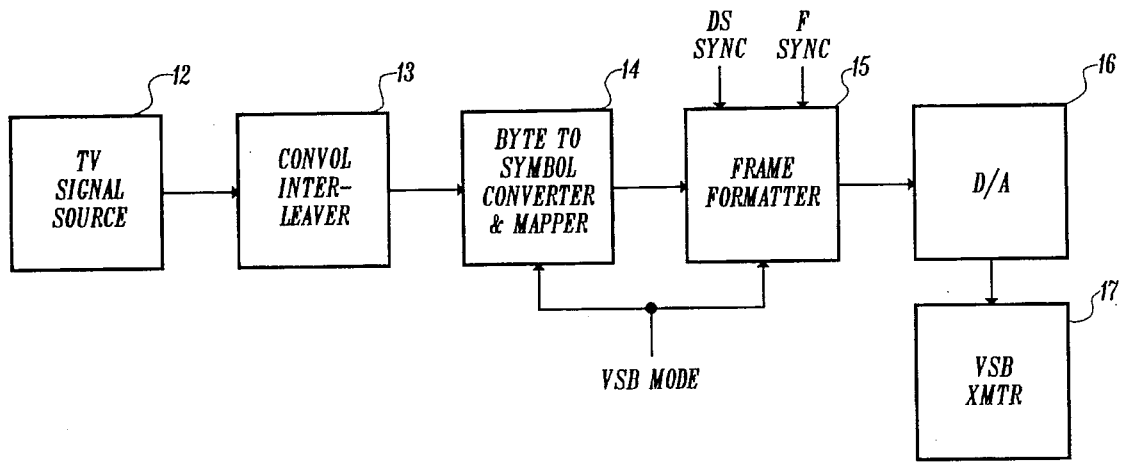
FIG. 3 is a simplified block diagram of a transmitter in accordance with the invention.

FIG. 3 is a simplified block diagram of a transmitter constructed in accordance with the invention. A source 12 of television signals is coupled to a convolutional interleaver 13 which, in turn, supplies interleaved data bytes to a byte to symbol converter and mapper 14. It will be appreciated that signal source 12 may comprise a compressed HDTV signal (or two compressed HDTV signals depending on the VSB mode) or a number of compressed NTSC signals. The symbol output of converter (and mapper) 14 is supplied to a frame formatter 15 that has inputs of data, data segment sync and frame sync and is controlled, along with converter 14, by a VSB mode control signal. The formatted frames, which conform to the arrangement previously described in connection with FIGS. 1 and 2, are supplied to a digital to analog (D/A) converter 16 and thence to a VSB transmitter 17 for transmission over a 6 MHz television channel. The transmission medium may comprise a cable television plant or a terrestrial broadcast environment. In either case, one such transmitter is required for each transmitted 6 MHz channel.

FIG. 3A is a chart illustrating a method of implementing the byte to symbol converter. The chart comprises four columns, one for each of the VSB modes M=16, M=8, M=4 and M=2. Converter 14 is operative in response to the applied VSB mode control signal for using the identified column of the chart of FIG. 3A for converting the input data bytes to output data symbols. For example, for VSB mode M=16, the input data byte 11010101 would be converted to two successive data symbols having relative amplitudes of +88 and −40. For VSB mode M=8, the input data byte would be converted to three successive data symbols having relative amplitudes of +80, +48 and −16 (assuming the first bit of the next data byte is 1) or +80, +48 and −48 (assuming the first bit of the next data byte is 0). For VSB mode M=4, the data byte would be converted to four successive symbols having relative amplitudes of +96, −32, −32 and −32. Finally, for VSB mode M=2, eight output symbols would be provided at relative amplitudes +64, +64, −64, +64, −64, +64, −64 and +64. In the case of VSB mode M=24, converter and mapper 14 includes appropriate memory and look-up tables for mapping successive groups of 9 input data bits into two successive 24 level output symbols. In this way each symbol can be referred to as representing 4.5 bits (i.e. 9 bits/2 symbols).

In connection with the foregoing, it will be observed that the relative levels of the symbols of each VSB mode are evenly spaced and lie midway between the relative levels of selected symbols of all higher VSB modes. For example, relative level 112 of VSB mode M=8 lies midway between relative levels +120 and +104 of VSB mode M=16, relative level +96 of VSB mode M=4 lies midway between relative levels +112 and +80 of VSB mode M=8 and midway between relative levels +104 and +88 of VSB mode M=16, relative level +64 of VSB mode M=2 lies midway between relative levels +96 and +32 of VSB mode M=4, +80 and +48 of VSB mode M=8 and +72 and +56 of VSB mode M=16, and so on. Preferably the symbol levels are offset from the values shown by a predetermined amount (e.g. +20) prior to transmission to provide a small pilot for facilitating carrier acquisition in the receiver. Also, it will be observed that the data rate characterizing each VSB mode increases by one bit per symbol relative to the data rate of the immediately lower VSB mode while its S/N ratio performance is reduced by one-half.

The above represents the situation in the version of the invention presently being implemented in chip form, in which 16 VSB is the highest mode. However, it will be apparent to those skilled in the art that the 24 VSB mode implementation will require different relative levels as taught by the invention. The technique and apparatus for processing a 24 VSB mode signal is discussed below and claimed in copending application Ser. No. 175,085 above.

FIG. 3B illustrates the general S/N ratio fall off of a cable plant with increasing frequency. As is specified in the invention, the higher S/N ratio transmission characteristics for lower frequency television signals can be used to advantageously employ higher VSB transmissions (and a higher data rate) for similar performance. The "noisier" portion of the spectrum (low S/N ratio) may be used for signals of lower VSB modes. It will be apparent that this technique optimizes the utilization of the cable plant.

Figure 4:
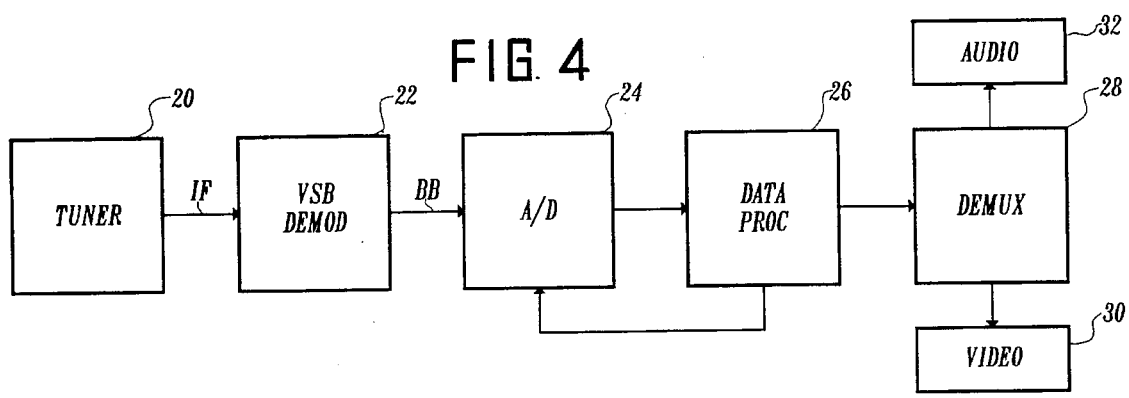
FIG. 4 is a simplified diagram of a receiver constructed in accordance with the invention.

FIG. 4 is a simplified block diagram of a receiver constructed according to the invention. The received RF television signal from the transmitter of FIG. 3 comprises an M-level VSB signal having the frame format of FIG. 1. The received signal is converted to an IF frequency by a tuner 20 and applied to a VSB demodulator 22. VSB demodulator 22 generates an analog baseband output signal comprising the M-level symbols at a rate of about 10.76 Megasymbols/sec. This analog signal is sampled by an analog to digital (A/D) converter 24 which converts the symbols to binary form and applies them to a data processor 26. Data processor 26 provides a feedback signal for controlling A/D 24 to insure that the analog baseband signal is sampled at the appropriate symbol times (see copending application Ser. No. 94,388). Data processor 26 applies the processed binary data, in the form of data bytes corresponding to the output of television source 12 in FIG. 3, to a demultiplexer 28, which distributes the received data to a video processor 30 and to an audio processor 32, each of which includes appropriate decompression circuitry.

Figure 5:
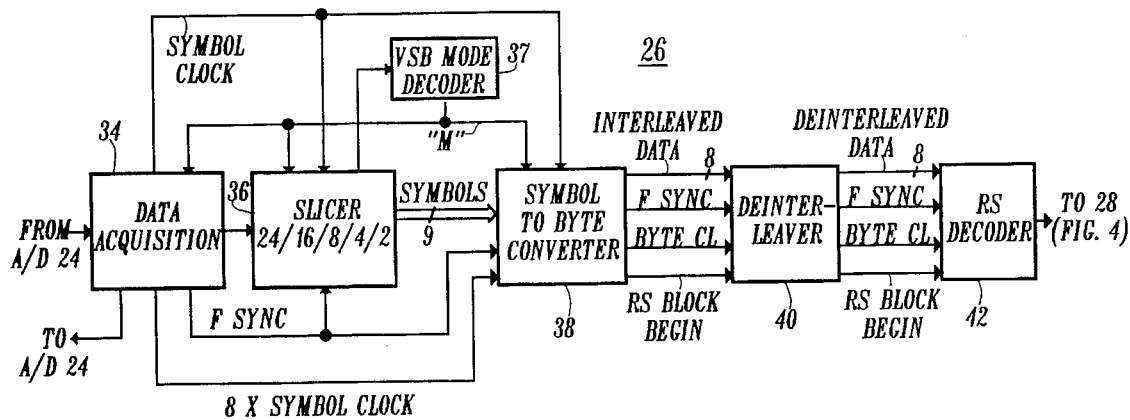
FIG. 5 is a more detailed showing of the data processor section of the receiver of FIG. 4.

Data processor 26 is shown in more detail in FIG. 5. The binary symbols from A/D are applied to a data acquisition circuit 34 which performs a number of functions including generating the feedback signal for controlling A/D 24, generating a symbol clock signal, generating a frame sync (FSYNC) signal and generating an 8 times symbol clock signal. The symbol clock signal has a frequency of about 10.76 MHz for all VSB modes except VSB mode M=24, in which case, as will be explained, its frequency is reduced by one-half to about 5.38 MHz. The FSYNC used in the preferred embodiment is approximately 41 Hz. The frame synchronization code of data segment DS0 enables derivation of the FSYNC signal which coincides in time with the first data symbol of data segment DS1 of each data frame 10.

The binary symbols from A/D 24 (representing the amplitudes of the sampled analog signal from VSB demodulator 22) are applied by data acquisition circuit 34 to a multi-level slicer 36 which converts the received symbols to bits according to the chart of FIG. 3A. As in the case of the transmitter, for VSB mode M=24, slicer 36 includes appropriate memory and look-up tables for mapping each successively received pair of symbols into 9 bits of output data. Slicer 36 couples the sliced values of the VSB mode control byte (eight 2-level symbols) of data segment DS0 of each frame to a VSB mode decoder 37, which detects the first three bits of the mode control byte and develops a 3-bit VSB mode select signal. This signal identifies the VSB mode (M=24, 16, 8, 4 or 2) of the received symbols for controlling data acquisition circuit 34, slicer 36 and a symbol to byte converter 38 during the remainder of the respective frame. The remaining 5 bits of the mode control byte are used for error detection by VSB mode decoder 37. Slicer 36, which includes a nine line output bus, is responsive to the VSB mode select signal for converting the binary signal, representing the symbol amplitudes, to their corresponding bit values. Thus, in the M=2 VSB mode, each binary symbol amplitude signal is converted to the corresponding 1-bit signal on one of the nine output lines, to the corresponding 2-bit signal on two of the output lines in the M=4 VSB mode, to the corresponding 3-bit signal on three of the output lines in the M=8 VSB mode and to the corresponding 4-bit signal on four of the output lines in the M=16 VSB mode. In the M=24 VSB mode, two successive symbols are converted to the corresponding 9-bit signal (on all nine output lines) at one-half the symbol clock rate.

The nine-line output of slicer 36, together with the 3-bit VSB mode select signal from decoder 37 and the timing signals from data acquisition circuit 34 are coupled to symbol to byte converter 38, which is claimed in copending application Ser. No. 175,070, above, the output of which supplies a deinterleaver 40 that, in turn, supplies an RS decoder 42. Symbol to byte converter 38 converts the input bits representing the received symbols into a series of 8-bit data bytes for each of the VSB modes. Deinterleaver 40 deinterleaves the convolutionally interleaved data bytes supplied by converter 38 and RS decoder 42 performs error correction on the deinterleaved data bytes.

Figures 6, 7, 9:
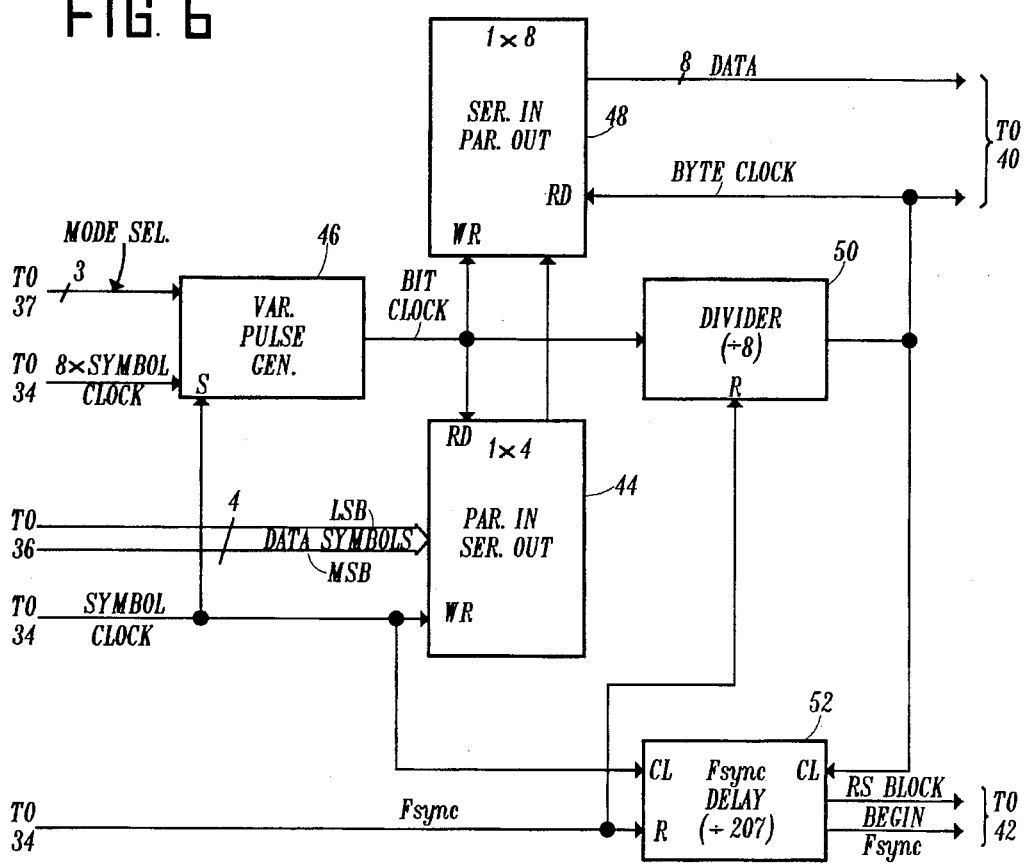
FIG. 6 is a more detailed showing of the symbol to byte converter of the data processor of FIG. 5.
FIG. 7 is a diagram of an exemplary matrix of address signals for deinterleaving a convolutionally interleaved data stream according to the invention.
FIG. 9 is a deinterleave address signal matrix suitable for use in an actual embodiment of the invention.

Symbol to byte converter 38 is shown in more detail in FIG. 6. The 9-line data symbol bus from slicer 36 and the symbol clock signal from data acquisition circuit 34 are applied to a 1×9 parallel-in, serial-out register 44. The 3-bit VSB mode signal, the symbol clock signal and the 8 times symbol clock signal are applied to the inputs of a variable pulse generator 46. Generator 46 produces a series of pulses (bit clocks) at the 8 times symbol clock rate in response to each received symbol clock, the series including one pulse for VSB mode M=2, two pulses for VSB mode M=4, 3 pulses for VSB mode M=8, and 4 pulses for VSB mode M=16. A series of 9 pulses are sent for VSB mode M=24, while the symbol clock is halved.

Assuming, for example, VSB mode M=8, the 3 bits from slicer 36 (representing a received symbol) are simultaneously written into the top three locations of register 44 in response to a symbol clock. At the same time, the symbol clock starts pulse generator 46 which produces 3 bit clocks (at 8 times the symbol clock rate) which are applied to the Read (RD) input of register 44, to the Write (WR) input of a 1×8 Serial-in, Parallel-out register 48 and to the input of a divide-by-eight circuit divider 50. Divider 50 is reset at the beginning of each data frame 10 by FSYNC for synchronizing converter 38 with the received data, since FSYNC always represents a byte boundary. The 3 bits previously loaded into register 44 are serially read out of register 44 in response to the 3 bit clock pulses and written into register 48. The next 3-bit symbol from slicer 36 is processed in the same manner, resulting in 6 bits being stored in register 48. After the first two bits of the next (i.e. third) 3-bit symbol are written into register 48 from register 44, divider 50 generates an output (Byte Clock) causing the accumulated 8-bit data byte stored in register 48 to be read out (in parallel). The remaining single bit of the third symbol is stored in register 48 and read out with the next 7 bits of the succeeding 3-bit symbol as the next data byte. In this manner, converter 38 arranges the input 3-bit symbols (for M=8) into a series of successive 8-bit output data bytes, which are supplied to deinterleaver 40 at the rate of the byte clock.

A substantially similar procedure is carried out for VSB modes M=2, 4 and 16 except that, depending on the VSB mode, it will take a longer or shorter time period to compose the data bytes. For example, in VSB modes M=2 and 4, the bit clock generated by pulse generator 46 in response to each symbol clock signal comprises one and two pulses respectively, so that 8 and 4 symbol clock signals are required to produce the respective data bytes (versus 2-⅔ for VSB mode M=8).

For VSB mode M=24, slicer 36 combines two 4.5 bit symbols into 9 bits at one-half the symbol clock rate and applies these signals to converter 38. Consequently, in response to each symbol clock, 9 bits from slicer 36 are loaded into register 44. Then, the 9 bits are serially read out of register 44 and written into register 48. However, after the 8th such bit has been written into the register, a Byte Clock output is generated by divider 50, reading these 8 bits out of register 48 as a data byte. The remaining bit will be read out of register 48 with the first 7 bits of the next symbol as the next data byte two symbol times later.

Converter 38 further includes a divider 52 which is also reset by FSYNC to synchronize its operation with the beginning of each data frame 10. In particular, divider 52 is a divide-by-207 counter which is clocked by the Byte Clock generated by divider 50 to generate a Begin RS Block signal for identifying the beginning of each block of 207 data bytes synchronously with the first data byte of each data frame. As will be explained hereinafter, this signal is used to synchronize the operation of RS decoder 42. Divider 52 includes means responsive to the symbol and byte clocks for converting the one-symbol-wide input FSYNC to a byte wide output FSYNC.

As described earlier, the outputs of converter 38 are applied to deinterleaver 40. As will be explained in further detail hereinafter, deinterleaver 40 deinterleaves the convolutionally interleaved data bytes received from converter 38 using a minimum of memory.

As is well known, interleaving is done at the transmitter (see interleaver 13 of FIG. 3) to spread contiguous data bytes apart from each other to help immunize the transmitted data from burst noise. In the receiver, the interleaved bytes must be deinterleaved to re-establish their original relationship prior to forward error correction. Thus, burst noise of some given time duration will corrupt only a limited number of bytes within an RS block of the deinterleaved data, which corrupted bytes can be corrected by the RS decoder. The interleaving algorithm used is selected in anticipation of the maximum expected burst noise duration at the fastest byte clock rate (i.e. corresponding to VSB mode M=24) to insure that the RS decoder is capable of error correcting the corrupted deinterleaved data bytes. Thus, as maximum expected burst noise duration increases, the interleaving algorithm must spread contiguous data bytes farther apart. Alternatively, a more powerful RS code may be used, but this approach has the disadvantage of using more overhead, i.e. requiring more bytes for error correction. Also, by referencing the system to the highest byte clock rate (corresponding to 24 VSB), increased burst error protection will be provided as the VSB mode and the corresponding byte rate decrease, because the interleave pattern is effected over a given number of bytes regardless of VSB mode.

Convolutional interleave algorithms are commonly used to immunize transmitted data from burst noise. Such algorithms delay the individual bytes of successive groups of bytes, sometimes referred to as the interleave depth, by different amounts to effectively scatter the bytes over a portion or all of the data frame. Deinterleaving is effected by delaying the received bytes by opposite amounts. In implementing such a system, three parameters are of particular significance; the maximum expected burst length BL, the number of byte errors T which the RS decoder can correct and the RS block size. As mentioned previously, there preferably are an integral number of RS blocks in the data frame so that the RS decoder can be synchronized by the frame sync signal FSYNC. By selecting an interleave group size (of which there are preferably an integral number in each frame) equal to a parameter B=BL/T and the different delays as integral multiples of a parameter N equal to or greater than the RS block size, the RS decoder will be able to correct the deinterleaved data for burst noise up to the maximum expected duration of BL byte clocks.

Consider the simplified example of a system in which the maximum expected burst length is 4 data byte clocks and the RS decoder is capable of correcting one data byte error in each 8 data byte RS block (i.e. BL=4, T=1, N=8). Using these parameters, the interleave group size B=BL/T=4/1=4. Convolutional interleaving is performed using these parameters such that for each group of B=4 data bytes, the first data byte is exposed to a delay of 0, the second to a delay of 1N=8 data byte clocks, the third to a delay of 2N=16 data byte clocks and the fourth to a delay of 3N=24 data byte clocks. Deinterleaving is effected by reversing the delays such that for each group of B=4 received interleaved data bytes, the first is delayed by 3N=24 data byte clocks, the second by 2N=16 data byte clocks, the third by 1N=8 data byte clocks and the fourth by 0.

Conventional convolutional deinterleavers implementing the above algorithm comprise a memory having (B−1)N/2 memory locations. For realistic values of B and N, which are typically much larger than the values used in the simplified example given above, this leads to a very complex architecture because of the large number of shift registers required. An alternate architecture which may be employed uses a standard linear memory array for which a large number of fifo head and tail pointers must be maintained in hardware. This is a very complex task and thus highly undesirable.

These problems are solved according to this invention by using a linear memory array with an address generator for generating a repeating sequence of read-write addresses that results in correctly deinterleaving the received data. The memory array is of a relatively small size utilizing only one memory location in excess of the number required to impose the different delays on the respective data bytes of each group. This invention is described below in relation to the simplified example given above and is extended to implementations using more realistic parameters.

More specifically, it has been discovered that a linear memory array having [(B−1)N/2]+1 memory locations may be addressed by a particular sequence of read-write addresses to correctly deinterleave a convolutionally interleaved data stream. The sequence of addresses is developed by first writing a column of [(B−1)N/2]+1 consecutive integers beginning with 0. This is represented by the first column of the addressing matrix of FIG. 7, which is for the simplified example with B=4 and N=8. Next a second column that is the same as the first is written except that it is rotated down by (B−1)N/B=(3×2)=6 rows. This is the second column in the matrix of FIG. 7. The third column is developed by rotating the second column down by (B−2)N/B=(2×2)=4 rows and, finally, the fourth and last column is developed by rotating the third column down by (B−3)N/B=(1×2)=2 rows. This matrix has a size of B=4 columns and [(B−1)N/2]+1=13 rows, the number of rows being the required size of the deinterleave linear memory array. If the numbers in the matrix are read out a row at a time, they can be used as read-write addresses for application to the deinterleave memory to continuously deinterleave the received data, i.e. read out the old data at the addressed memory location and write in the new data at the same location.

Figure 8:
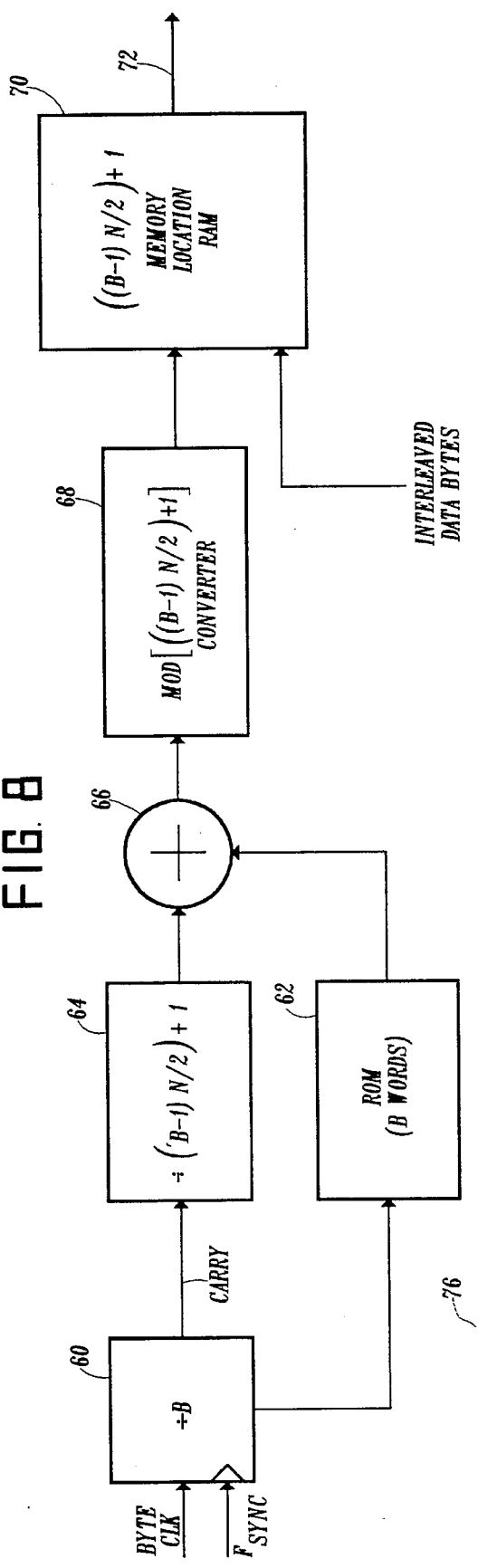
FIG. 8 is a generalized circuit operable for generating memory address signals according to the invention, including those illustrated in FIG. 7.

A circuit for generating the address matrix of FIG. 7 is illustrated in FIG. 8. A divide by B up-counter 60, which is reset to zero by FSYNC, is responsive to the byte clock from converter 38 for applying a repeating sequence of counts from a minimum number to a maximum number, e.g. from 0 to (B−1), for addressing a B word ROM 62 at the byte clock rate. ROM 62 stores the B words comprising the first row of the address matrix. The carry output of divider 60 is used to clock a second divider 64 at the slower rate of byte clock/B, the division ratio of divider 64 being [(B−1)N/2]+1. The outputs of divider 64 and ROM 62 are summed in an adder 66 and applied through a modulo [(B−1)N/2]+1 converter 68 for addressing a linear deinterleave memory array 70 having [(B−1)N/2]+1 memory locations. Converter 68 preferably comprises a circuit which either couples its input signal to its output or, if the input is greater than [(B−1)N/2]+1, subtracts this value from the input signal before coupling it to its output.

For the simplified example described above, i.e. B=4 and N=8, divider 60 (÷4) repetitively generates the output count sequence 0, 1, 2, 3 for addressing and reading the four words 0, 7, 3, 1 stored in ROM 62 at the byte clock rate. Divider 64 (÷13) repetitively generates the output sequence 0, 1, 2 . . . 12 at ¼ the byte clock rate. Consequently, for each group of 4 successive byte clocks, the four words 0, 7, 3, 1 read from ROM 62 are each added to the output of divider 64 in adder 66 to produce, after processing by modulo 13 converter 68, a row of the address matrix of FIG. 7. For example, the first row 0, 7, 3, 1 of the matrix is produced during the first four byte clocks wherein 0 (from divider 64) is added to the outputs 0, 7, 3, 1 of ROM 62. During the next 4 byte clocks the value 1 (from divider 64) is added to the words 0, 7, 3, 1 generated by ROM 62 to produce the second row 1, 8, 4, 2 of the address matrix and so on until finally the last row is generated by adding 12 to each of the 4 words 0, 7, 3, 1 to produce the last row 12, 6 (=19 modulo 13, 2 (=15 modulo 13), 0 (=0 modulo 13).

Each address signal generated at the output of modulo 13 converter 68 initiates a read-write operation of RAM 70. That is, each address first causes the data byte stored at the addressed memory location to be read out on bus 72 and then the new interleaved data byte to be written into the same memory location. By following the addressing scheme disclosed herein, the data bytes read from RAM 70 will be in the correct deinterleaved format. The fact that the input data bytes are correctly deinterleaved can be seen from a close examination of the matrix of FIG. 7. In particular, it will be recalled that convolutional interleaving is effected for each group of four data bytes by delaying the first data byte by 0, the second data byte by 8 byte clocks, the third data byte by 16 byte clocks and the fourth data byte by 24 byte clocks. Theoretically, deinterleaving is then effected by delaying the first received data byte by 24 byte clocks, the second received data byte by 16 byte clocks, the third received data byte by 8 byte clocks and the fourth received data byte by 0 byte clocks. Adding a one byte clock delay to each received data byte will not affect the deinterleaving process so that delays of 25, 17, 9, 1 data clocks are equivalent to using deinterleaving delays of 24, 16, 8, 0 data clocks. Referring to the matrix of FIG. 7, the first received data byte is written into memory location 0 of RAM 70 and read out 25 byte clocks later at column 2, row 7 (i.e. after a delay of 25 byte clocks), the second is written into memory location 7 and read out 17 byte clocks later at column 3, row 5, (i.e. after a delay of 17 byte clocks), the third is written into memory location 3 and read out 9 byte clocks later at column 4, row 3 (i.e. after a delay of 9 byte clocks) and the fourth is written into memory location 1 from which it is read out 1 byte clock later at column 1, row 2 (i.e. after a delay of 1 byte clock). It will be apparent from this analysis that the deinterleaving algorithm is correctly executed.

In an embodiment of the invention actually being constructed for use in a cable television system the following parameters were selected: BL=260 bytes, T=10 and N=208. Therefore, B=BL/T=26 bytes, which is integrally related to the frame size for all VSB modes. For this case divider 60 of the circuit of FIG. 8 is a divide-by-26 divider (periodically reset by FSYNC) which sequentially address the 26 words of ROM 62 comprising the first row of the address matrix (0, 2401, . . . 1) shown in FIG. 9. Divider 64 is a divide by 2601 divider and converter 68 is a modulo 2601 converter. Operation of this embodiment of the circuit is identical to that described for the simplified example.

Figure 10:
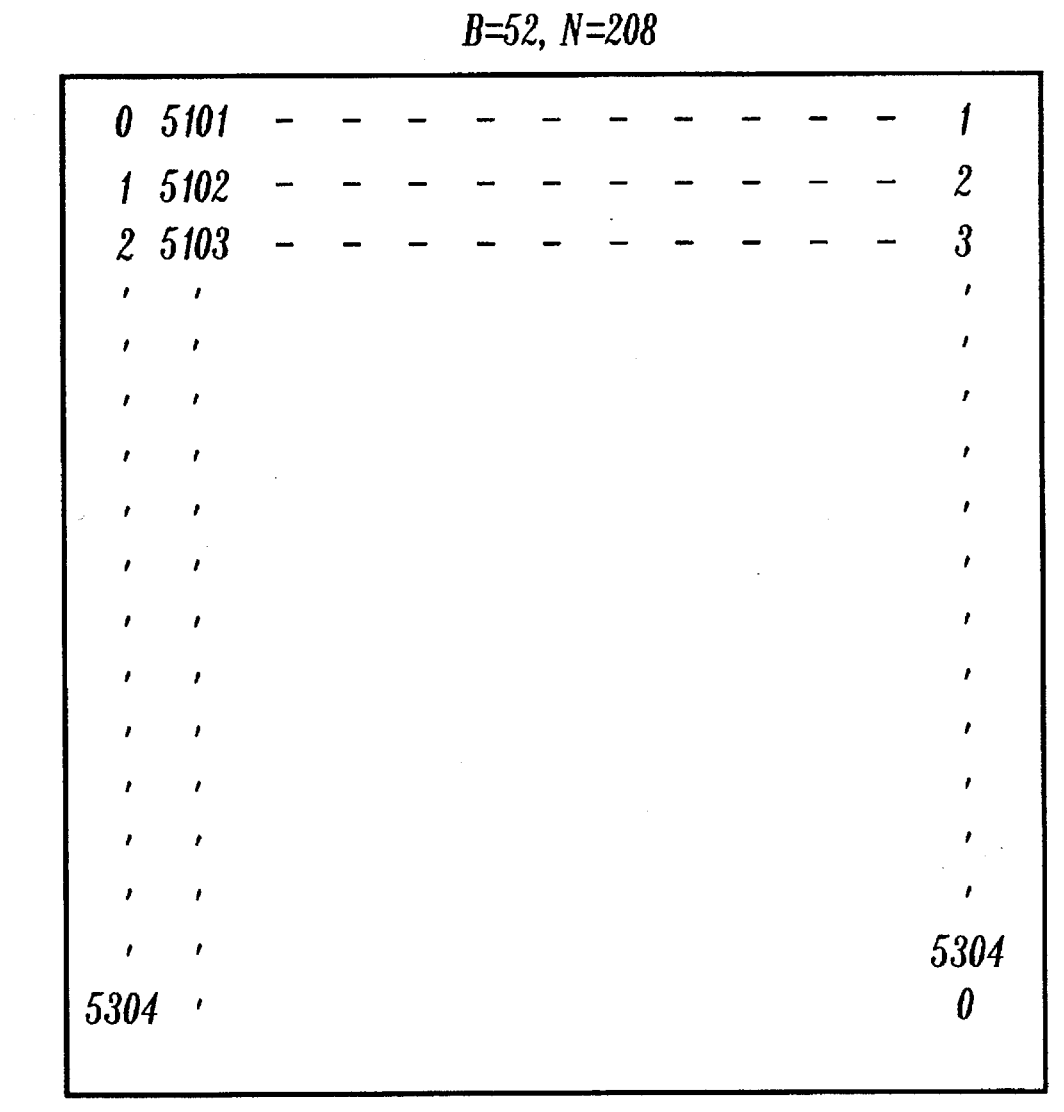

As previously mentioned, the system parameters may have values other than those given above. For example, in a terrestial application it may be desirable to increase the interleave depth B since a larger maximum burst noise length is to be expected. Thus, in a terrestial application the following parameters may be used: BL=520 bytes, T=10 and N=208. Therefore B=BL/T=52. The address matrix for these parameters (B=52 and N=208) is shown in FIG. 10. The circuit of FIG. 8 may also be used for generating the address matrix of FIG. 10 by substituting the appropriate values of B and N in the various circuit elements.

Figure 11:
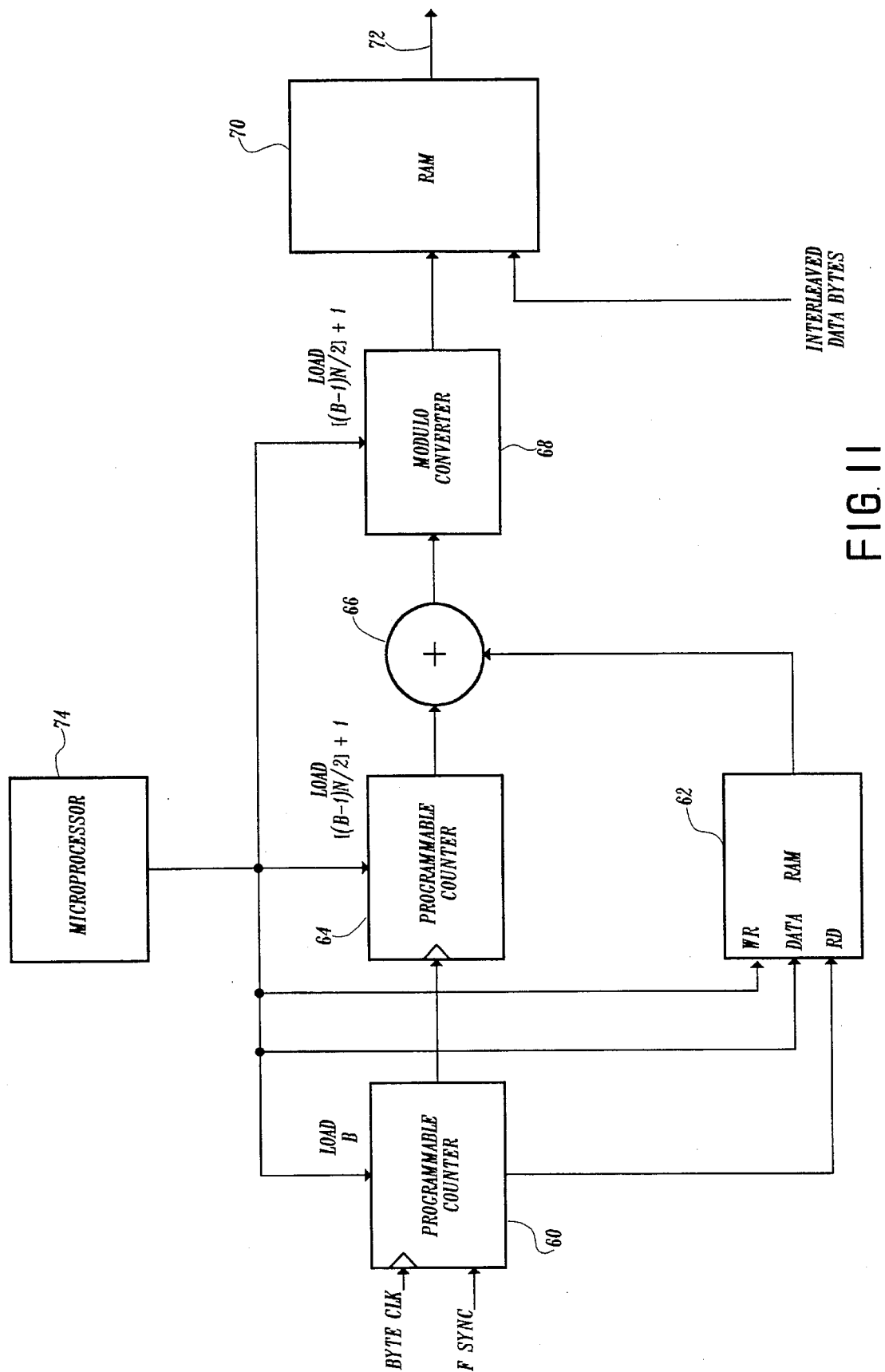
FIG. 11 is a programmable embodiment of the circuit of FIG. 8.

It may also be desirable to provide the circuit of FIG. 8 in a programmable form for selectively generating either the address matrix of FIG. 9 or the address matrix of FIG. 10. Such a circuit is shown in FIG. 11 wherein a microprocessor 74 is used at initialization to program counters 60 and 64 and modulo converter 68 with the appropriate values of B and N. Also, microprocessor 74 initializes memory 62 by loading the first row of addresses from either the matrix of FIG. 9 or FIG. 10. Thus, the circuit may be selectively operated in a first mode (B=26, N=208) by loading the value 26 into counter 60, the value 2601 into counter 64 and modulo converter 68 and by writing the first row of addresses form the matrix of FIG. 9 into memory 62. The circuit may be operated in a second mode to provide a larger interleave depth (B=52, N=208) by loading the value 52 into counter 60, the value 5305 into counter 64 and modulo converter 68 and by writing the first row of addresses from the matrix of FIG. 10 into memory 62. It will be understood that once programmed the circuit will operate as previously explained in connection with FIG. 8.

It will be noted that the circuits of FIGS. 8 and 11 automatically adapt to the different received VSB modes. The circuits simply operate at an increased or decreased rate in response to the byte clock as the VSB mode varies. The deinterleaved data on bus 72, together with the FSYNC and Begin RS Block signals from converter 38 are applied to RS decoder 42 which error corrects the deinterleaved data bytes.

Operation of RS decoder 42 is facilitated by synchronization with FSYNC at the beginning of each data frame and by providing an integral number of RS blocks each frame regardless of the VSB mode as previously explained.

Figure 12:
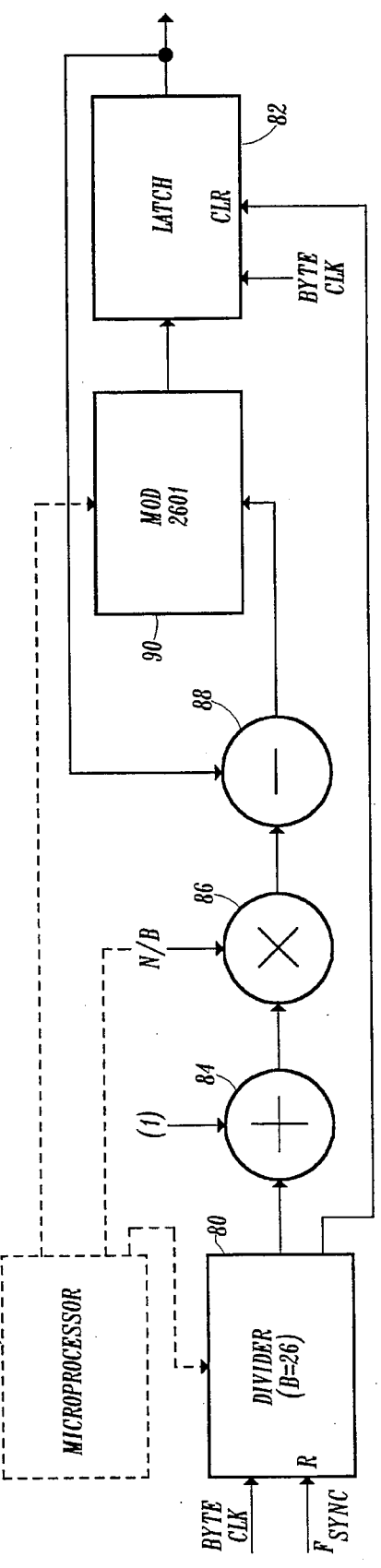
FIG. 12 is a replacement circuit for for the ROM of FIG. 8 or the RAM of FIG. 11.

FIG. 12 shows a circuit which may be used in place of memory 62 of FIGS. 8 or 11 to generate the first row of matrix addresses. The circuit implements the following equations for generating the first row of addresses C (X):

$$C(0)=0$$

$$C(X)=[C(X-1)-(B-X)N/B]\bmod[(B-1)N/2+1],$$

where X=1, ... (B-1).

For the simplified example (i.e. B=4 and N=8) the term C(X) becomes C(X)=[C(X-1)-(4-X)2]mod 13. Thus, for example, if X=1, C(X)=(0-6)mod 13=-6 mod 13=7. Similarly, for X=2, C(X)=(7-4) mod 13=3. And finally, for X=3, C(X)=(3-2) mod 13=1. The first row for the larger matrices of FIGS. 9 and 10 may likewise be derived using these relationships. Referring to FIG. 12, the circuit comprises an input divide by B count down divider 80 which is reset by FSYNC and clocked by the byte clock. In response to being reset, an output of divider 80 clears a latch 82. The output of divider 80 is provided in reverse order (B-1, B-2, ... 0) so that when it is incremented by one (1) in an adder 84, the result is (B-X). The variable (B-X) is multiplied by N/B in a multiplier 86 to provide the expression (B-X)N/B. Multiplier 86 may comprise a relatively simple bit-shifting circuit since, in both embodiments, the factor N/B is a power of two (i.e. 208/52=4 and 208/26=8). Expression (B-X) N/B is then subtracted from the output C(X-1) of latch 82 in subtractor 88 to provide C(X-1)-(B-X)N/B. Finally, the output of the subtractor is coupled by a modulo [(B-1)N/2]+1 circuit for temporary storage in latch 82 in response to a byte clock. As in the previous case, the circuit may be made programmable by providing a microprocessor 76 or other suitable controller for loading the appropriate divisor in divider 80, the value N/B into multiplier 86 and the value [(B1)N/2]+1 into modulo converter 90 upon initialization.

Figure 13:
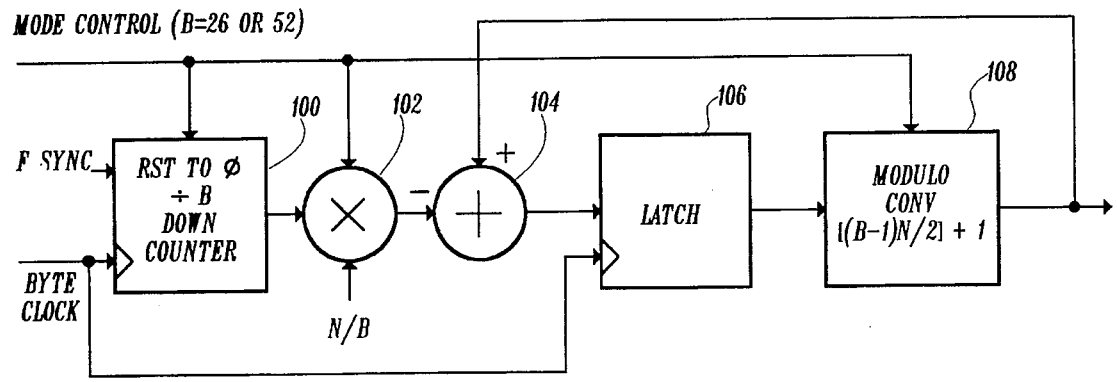
FIG. 13 is a block diagram showing an alternate embodiment of a convolutional deinterleaver according to the invention.

FIG. 13 illustrates an alternate embodiment of the deinterleaver circuits of FIGS. 8 and 11. In this embodiment a divide-by-B down-counter 100 is reset to zero by FSYNC and clocked by the byte clock. The output of counter 100 supplies one input of a multiplier 102, whose other input is supplied with the value N/B. As in the case of multiplier 86 of FIG. 12, multiplier 102 preferably comprises a bit-shifter since for both modes B=26 and B=52 the value N/B comprises a power of two. The output of multiplier 102 is applied to the negative input of a subtracting circuit 104, the output of which is applied by a latch 106 to the input of a modulo [(B-1)N/2]+1 converter 108. The output of converter 108, which represents the address signal sequences applied to memory 70 (see FIG. 8), is coupled back to the positive input of subtractor 104. As in the previous embodiments, a B=26 or B=52 mode control signal may be applied to counter 100, multiplier 102 and converter 108 for effecting operation in either of the respective modes.

Considering the simplified example of B=4, N=8, assume that counter 100 has just been reset to zero and that the current output of converter 108 is zero. Consequently, a value of zero will be developed at the outputs of both multiplier 102 and subtractor 104 and applied by latch 106 for development at the output of converter 108. The output of counter 100 next increments to a value of 3 so that the output of multiplier 102 goes to 6 and the output of subtractor 104 to -6. The value -6 is coupled by latch 106 to converter 108 where it is converted to the value 7. The output of counter 100 next increments to a value of 2 causing the output of converter 108 to assume the value of [7-(2×2)] modulo 13=3. The next byte clock causes the output of counter 100 to increment to a value of 1 and the output of converter 108 to assume the value [3-(2×1)] mod 13=1. Referring to FIG. 7, it will be seen that these four consecutive outputs comprise the first row of the address signal matrix. It will be understood that the subsequent rows of the address signal matrix are generated in a like manner and, when used to address the linear memory 70 as previously described, properly deinterleave the received convolutionally interleaved data bytes.

While the previous discussion has largely focused on the implementation of convolutional deinterleavers according to the invention, it will be understood that essentially the same techniques can be applied to the design and construction of convolutional interleavers. In particular, in order to provide a convolutional interleaver according to the invention it is only necessary to reverse the order of the address signal sequence represented by the matrices of FIGS. 7, 9 and 10 and to make some relatively minor circuit changes. The reversed order addressing matrix for the simplified case of B=4 and N=8 is shown in FIG. 14. The first column of the matrix is developed by writing a column of [(B-1)N/2]+1= 13 consecutive integers beginning with 12 and ending with 0. The second column comprises the first column rotated down by (B-3)N/B=(1×2)=2 rows, the third column comprises the second column rotated down by (B-2)N/B =2×2)=4 rows, and the fourth column comprises the third column rotated down by (B-1)N/B=(3×2)=6 rows. Similar interleave address signal matrices may be developed for the cases of B=26, N=208 and B=52, N=208, and these are shown in FIGS. 15 and 16 respectively.

The circuits of FIGS. 8 and 11 may be made to operate in an interleave mode by configuring counter 60 as a down-counter and by storing the last row of the respective address signal matrix of FIG. 14, 15 or 16 in memory 62. With these changes, the output 72 of memory 70 will comprise the desired convolutionally interleaved data stream.

Figure 17:
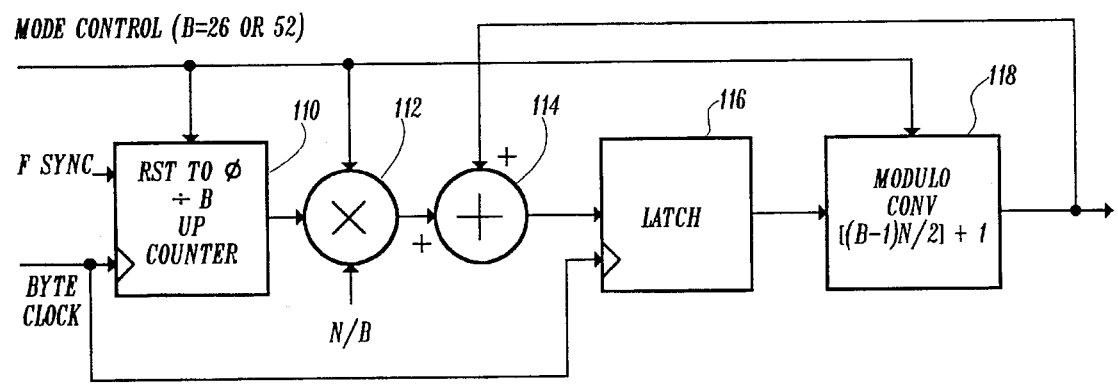
FIG. 17 is a block diagram showing an alternate embodiment of a convolutional interleaver according to the invention.

An alternate interleaver embodiment, similar to the deinterleaver embodiment of FIG. 13, is shown in FIG. 17. In this embodiment a divide-by-B up-counter 110 is reset to zero by FSYNC and clocked by the byte clock. The output of counter 110 supplies one input of a multiplier 112, whose other input is supplied with the value N/B. As in the previous embodiments, multiplier 112 preferably comprises a bit-shifter since for both modes B=26 and B=52 the value of N/B comprises a power of two (i.e. 208/26=8 and 208/52= 4). The output of multiplier 112 is applied to one input of an adder 114, the output of which is applied by a latch 116 to the input of a modulo [(B-1)N/2]+1 converter 118. The output of converter 118, which represents the address signal sequences applied to memory 70, is coupled back to the second input of adder 114. A B=26 or B=52 mode control signal may be applied to counter 110, multiplier 112 and converter 118 for effecting operation in either of the respective modes.

Considering again the simplified example of B=4, N=8, and assuming that the current output of converter 118 is 0, the address signal matrix of FIG. 14 is generated by the circuit of FIG. 17 as follows. Counter 110 will produce successive outputs of 0, 1, 2, 3, 0, 1, 2, 3 ... in response to the byte clock. Multiplier 112 will therefore produce the corresponding outputs 0, 2, 4, 6, 0, 2, 4, 6 ... The corresponding outputs of adder 114 and latch 116 are therefore 0(0+0), 2(2+0), 6(4+2), 12(6+6), 12 (0+12), 14(2+

12), 5(4+1), 11(6+5) . . . and the outputs of converter 118 are 0,2,6,12,12,1 (14 modulo 13), 5, 11 . . . It will be seen that the latter outputs comprise the last and first rows respectively of the address signal matrix of FIG. 14 and that the remaining rows will be generated in a like manner. The output of converter 118, when used to address a memory such as linear memory 70 will therefore properly interleave the data bytes prior to transmission.

The following claims are directed to the convolutional interleavers and deinterleavers of the invention. It will be appreciated that the invention is limited only as defined in the claims.

We claim:

1. Apparatus for convolutionally interleaving or deinterleaving a data signal comprising:

means for generating $((B-1)N/2)+1$ sequences of address signals, each of said sequences corresponding to a respective row of a B column matrix, the first column of said matrix comprising $(B-1)N/2)+1$ consecutively numbered values and each of the remaining columns comprising the preceding column rotated by a selected amount, where B and N are values related respectively to a selected interleave depth and a selected error correction block size of said data signal;

memory means having $((B-1)N/2)+1$ storage locations; and means for applying each of said address signals to said memory means for initially reading the data stored at the addressed memory location and for subsequently writing current data from said data signal into the addressed memory location.

2. The apparatus of claim 1 wherein the first column of said matrix begins with or ends with a zero value.

3. The apparatus of claim 1 wherein said generating means comprises means for generating said sequences of address signals such that each of said remaining columns of said matrix comprises the preceding column rotated by a factor $(B-I)N/B$, where I is an index value which increases by unity from a value of 1 to a value of $(B-1)$ or from a value of $(B-1)$ to a value of 1 for each successive one of said remaining columns.

4. The apparatus of claim 3 wherein N=208 and B=26 or 52.

5. The apparatus of claim 1 wherein said data signal comprises a plurality of successive data frames, each of said data frames comprising an integral number of R-S blocks characterized by a predetermined number of data bytes, said value N being selected to have a value equal to or greater than said predetermined number.

6. The apparatus of claim 2 wherein said generating means comprises means for initiating generation of said address signal sequences in synchronism with said data frames.

7. The apparatus of claim 5 wherein said predetermined number is equal to 207 and N is equal to 208.

8. The apparatus of claim 3 wherein B is equal to 26.

9. The apparatus of claim 3 wherein B is equal to 52.

10. A method of convolutionally interleaving or deinterleaving a stream of data bytes comprising:

repeatedly developing a first predetermined sequence of numbers;

developing a second sequence of numbers, at a lower rate, extending from a first number to a second number;

combining each number of said second sequence of numbers with each of the numbers of said first sequence of numbers to generate a sequence of addresses to address memory locations;

reading the stored data byte at each addressed memory location; and writing a new data byte to the same addressed memory location.

11. The method of claim 10 wherein said first sequence of numbers comprises B numbers and wherein said second sequence of numbers is developed at a rate of 1/B relative to said first sequence of numbers.

12. The method of claim 11 wherein each of said first sequence of numbers is developed by addressing a memory containing B words.

13. The method of claim 11 wherein B is equal to a maximum expected interference duration divided by the number of correctable data byte errors in a predetermined number of said data bytes read from said addressed memory locations.

14. The method of claim 11 including subtracting the maximum of said first and second numbers from each number of said combined sequence exceeding said maximum number for generating said sequence of addresses.

15. The method of claim 14 wherein said first number is equal to 0.

16. The method of claim 15 wherein said second number is equal to 2600 or 5304.

17. The method of claim 14 wherein said first number is equal to 600 or 5304.

18. The method of claim 17 wherein said second number is equal to 0.

19. A circuit for convolutionally interleaving or deinterleaving a stream of data bytes comprising:

first number generating means for repeatedly developing a first predetermined sequence of B numbers, where B is related to a selected interleave depth of said stream of data bytes;

second number generating means for developing a second sequence of $((B-1)N/2)+1$ numbers at a slower rate and extending from a first number to a second number, where N is related to a selected error correction block size of said stream of data combining means for combining each number of said second sequence of numbers with each of the numbers of said first sequence of numbers and producing an output;

a memory for storing data bytes;

means for supplying said stream of data bytes to said memory; and means for sequentially addressing memory locations in said memory under control of said output to read a data byte from said addressed location and to write a data byte to the same addressed location.

20. The circuit of claim 19 wherein B equals a maximum interference duration divided by the number of correctable data byte errors in a predetermined number of said data bytes read from said addressed memory locations.

21. The circuit of claim 19 wherein said second number generating means operates at a rate of 1/B relative to said first number generating means.

22. The circuit of claim 20 wherein said addressing means includes a modulo $[(B-1)N/2]+1$ converter supplied with said output and coupled to said memory.

23. The circuit of claim 19 wherein said stream of data bytes forms a plurality of successive data frames, each of said data frames comprising a plurality of R-S blocks characterized by a predetermined number of data bytes, N being selected to have a value equal to or greater than said predetermined number.

24. The circuit of claim 23 wherein N=208 and B=26 or 52.

25. The circuit of claim 19 wherein said first number generating means comprises a memory containing B words.

26. The circuit of claim 25, further including:
means for generating a byte clock and a divide-by-B first counter; said second number generating means comprising a divide-by-((B−1)N/2)+1 second counter; said first counter, responsive to said byte clock, sequentially addressing said B word memory at the rate of said byte clock for generating said first sequence of B numbers and said first counter clocking said second counter at a rate of byte clock/B for generating said second sequence of numbers.

27. The circuit of claim 26 wherein said stream of data bytes forms a plurality of successive data frames and including means for resetting said first counter in synchronism with said data frames.

28. The circuit of claim 26 wherein said first counter comprises an up-counter and said first number is equal to 0.

29. The circuit of claim 28 wherein said second number is equal to 2600 or 5304.

30. The circuit of claim 26 wherein said first counter comprises a down-counter and said first number is equal to 2600 or 5304.

31. The circuit of claim 30 wherein said second number is equal to 0.

32. A circuit for convolutionally interleaving or deinterleaving a data stream comprising successive equal length blocks of R-S encoded data bytes, said circuit comprising:

a divide-by-B counter responsive to a byte clock signal for generating an output count, where B is a selected interleave depth;

means for multiplying said output count by the factor N/B, where N is a value equal to or greater than the number of data bytes comprising said R-S blocks;

a modulo [(B−1)N/2]+converter; and a combining circuit for combining the output of said multiplying means and the output of said modulo converter and applying said combined signal to the input of said modulo converter.

33. The circuit of claim 32 wherein N=208 and B=26 or 52.

34. The circuit of claim 32 wherein said stream of R-S encode data bytes is provided in the form of a plurality of successive data frames and including means for resetting said divide-by-B counter in synchronism with said data frames.

35. The circuit of claim 32 including a latch for applying said combined signal to said modulo converter.

36. The circuit of claim 32 wherein said divide-by-B counter comprises a down-counter and said combining circuit comprises means for subtracting said output count from the output of said modulo converter.

37. The circuit of claim 32 wherein said divide-by-B counter comprises an up-counter and said combining circuit comprises means for adding said output count to the output of said modulo converter.

* * * * *

UNITED STATES PATENT AND TRADEMARK OFFICE
CERTIFICATE OF CORRECTION

PATENT NO. : 5,572,532
DATED       : November 5, 1996
INVENTOR(S) : Mark Fimoff, Scott F. Halozan, Raymond C. Hauge It is certified that error appears in the above–identified patent and that said Letters Patent is hereby corrected as shown below:

Column 13

In claim 1, line 6, before "(" add --(--;
In claim 6, line 1, cancel "2" and substitute therefor -- 5 --;
In claim 8, line 1, cancel "3" and substitute therefor -- 7 --;
In claim 9, line 1, cancel "3" and substitute therefor -- 7 --;

Column 14

In claim 17, line 2, cancel "600: and substitute therefor -- 2600 --;
In claim 22, line 1, cancel "20" and substitute therefor -- 21 --;

Signed and Sealed this

Fourth Day of March, 1997

Attest:

BRUCE LEHMAN

Attesting Officer        Commissioner of Patents and Trademarks